United States Patent

Gruenewald et al.

[11] Patent Number: 5,814,998
[45] Date of Patent: Sep. 29, 1998

[54] DEVICE AND METHOD FOR LOCATING PARTIAL DISCHARGES WITH DETACHABLE COUPLING UNITS

[75] Inventors: Peter Gruenewald; Juergen Weidner, both of Essen; Gerhard Schimmelpfennig, Wesel; Reinhold Koziel, Mulheim an der Ruhr, all of Germany

[73] Assignee: Siemens Aktiengesellschaft, Munich, Germany

[21] Appl. No.: 656,887

[22] Filed: May 30, 1996

[30] Foreign Application Priority Data

Nov. 17, 1995 [DE] Germany ............. 295 18 286 U

[51] Int. Cl.⁶ ................................ G01R 31/08
[52] U.S. Cl. ............. 324/536; 324/72; 324/535; 324/772
[58] Field of Search ............ 324/72, 512, 520, 324/528, 535, 536, 546, 547, 548, 551, 772; 361/111, 113

[56] References Cited

U.S. PATENT DOCUMENTS

| | | | |
|---|---|---|---|
| 3,505,597 | 4/1970 | Cronin et al. | 324/536 X |
| 3,612,992 | 10/1971 | Cronin | 324/536 X |
| 4,277,746 | 7/1981 | Abe et al. | 324/72 |
| 4,446,420 | 5/1984 | Drouet | 324/536 X |
| 4,779,051 | 10/1988 | Grunewald et al. | 324/536 |
| 4,882,682 | 11/1989 | Takasuka et al. | 324/536 X |
| 4,897,607 | 1/1990 | Grunewald et al. | 324/536 X |
| 5,107,447 | 4/1992 | Ozawa et al. | 324/536 X |
| 5,146,170 | 9/1992 | Ishikawa et al. | 324/536 |
| 5,200,737 | 4/1993 | Konishi et al. | 324/536 X |
| 5,256,976 | 10/1993 | Ishikwa et al. | 324/536 X |

FOREIGN PATENT DOCUMENTS

| | | |
|---|---|---|
| 0 228 613 B1 | 8/1990 | European Pat. Off. . |
| 0 241 764 B1 | 8/1990 | European Pat. Off. . |
| 83 2 316 U | 7/1983 | Germany . |
| 39 12 506 A1 | 3/1990 | Germany . |
| 41 24 268 A1 | 8/1992 | Germany . |
| 41 20 821 A1 | 1/1993 | Germany . |
| 42 21 865 A1 | 1/1994 | Germany . |
| 42 31 713 A1 | 3/1994 | Germany . |
| 94 10 813 U | 6/1994 | Germany . |
| 195 07 826 A1 | 8/1995 | Germany . |
| WO 90/05919 | 5/1990 | WIPO . |

OTHER PUBLICATIONS

Hutter, W., Partial Discharges—Part XII: Partial Discharge Detection in Rotating Electrical Machines, IEEE Electrical Insulation Magazine, vol. 8, No. 3, May/Jun. 1992, pp. 21–32.

*Primary Examiner*—Diep N. Do
*Attorney, Agent, or Firm*—Herbert L. Lerner; Laurence A. Greenberg

[57] ABSTRACT

A device and a method for locating partial discharges in dynamoelectric high-voltage machines and/or high-voltage systems, comprising at least two coupling units (16, 17, 18) which are coupled to mutually spaced measuring points (MP1, MP2, MP3, ES, TS, AKV) of a conductor (2) of the high-voltage machine and/or high-voltage system, and couple out a high-frequency electromagnetic signal produced upon the occurence of partial discharges. The device further comprises an evaluation device which is electrically connected to each coupling unit (16, 17, 18) and records the temporal sequence of the signals coupled out by each coupling unit (16, 17, 18). The place of origin of the partial discharges can be determined from the temporal sequence of the signals, it being possible to enhance the accuracy by additional measurements at further measuring points.

18 Claims, 4 Drawing Sheets

MP1-MP2

ES-TS

DEVICE AND METHOD FOR LOCATING PARTIAL DISCHARGES WITH DETACHABLE COUPLING UNITS

BACKGROUND OF THE INVENTION

As capital intensive installations, dynamoelectric high-voltage machines and/or high-voltage systems, which can be generators in power stations, for example, require a high availability in order to be able to operate them as economically as possible. Early detection of impending damage in the individual system parts is expedient for the purpose of enhancing the availability of a high-voltage machine and/or high-voltage system. The extent of possible damage can be limited by timely detection of an impending fault, it being possible to avoid further-reaching severe damage, and thus long down-times for repair work.

It is known that faults in electrical systems or system components make themselves known well before the occurence of the actual damage by forming partial discharges or break sparks. The partial discharges are high-frequency oscillations.

It is known that measurements are carried out in power units continuously or at regular time intervals and are used to verify a determination of the trend of the high-frequency partial discharges. This mode of operation permits reliable early detection of faults in electrical equipment.

EP 0 228 613 B1 discloses a device and a method for detecting partial discharges and measuring break sparks in dynamoelectric high-voltage machines, in particular for the operational monitoring of the condition of insulation of the stator winding and the connected electric main leads in the case of turbogenerators. The device comprises at least one partial-discharge measuring instrument in which measuring leads connected via coupling filters are provided, in particular for the operational monitoring of the condition of insulation of the stator winding and the connected electric main leads in the case of turbogenerators. At least one steady-state inductive coupling loop is coupled as receiving antenna to the measuring lead in the immediate vicinity the dipole field of the machine shaft. This device is a device which is arranged in a stationary fashion and renders possible early detection of faults in the condition of insulation of the stator winding.

EP 0 241 764 B1 contains a description of a method for detecting and locating damage in a generator, in which measurements of partial discharges are carried out at a plurality of points, on the one hand in an electric fashion, and on the other hand on an ultrasonic basis. When measured values which indicate damage occur, they are compared with simulated signal values for various instances of damage and types of damage, in particular with regard to the frequency spectrum, propagation time, amplitude and/or phase angle. The location of the damage is determined from the simulated signal values, which at best correspond to the measured values, and the associated simulated damage. Signals which indicate damage are stored, and a comparison between high-frequency and ultrasonic signals takes place within the scope of a plausibility check.

The article "Partial Discharges—Part XII: Partial Discharge Detection in Rotating Electrical Machines" by W. Hutter in IEEE Electrical Insulation Magazine, May–June 1992—Volume 8, No. 3, Pages 21–32 discloses the detection of partial discharging in turbogenerators, in particular inside the winding of the turbogenerator. In this case, electrical signals caused by the partial discharges are detected in off-line measurements for which the turbogenerator is at a standstill and does not itself output electric power, as well as in on-line measurements. In the case of on-line measurements, a signal is coupled out at a fixed measuring point or at two fixed measuring points, for example at the end of a respective winding system of the turbogenerator. It is possible to locate the place of origin of partial discharges by means of propagation time measurements (not specified more closely) only in the case of partial discharges which are produced between the fixed unalterable measuring points.

Power stations are highly complex installations which can have a substantial spatial extent. Although the devices and methods known to date do render early fault detection possible, they do not even approximately permit location of the fault to be determined. This renders a substantial expenditure of time necessary in order to locate a possible fault location. In addition to the substantial expenditure of time, the outlay on apparatus for locating the fault can also be very high.

SUMMARY OF THE INVENTION

Proceeding from this, it is the object of the present invention to specify a device and a method for fault detection so that the fault can be located simply and at least approximately.

Figure 1:
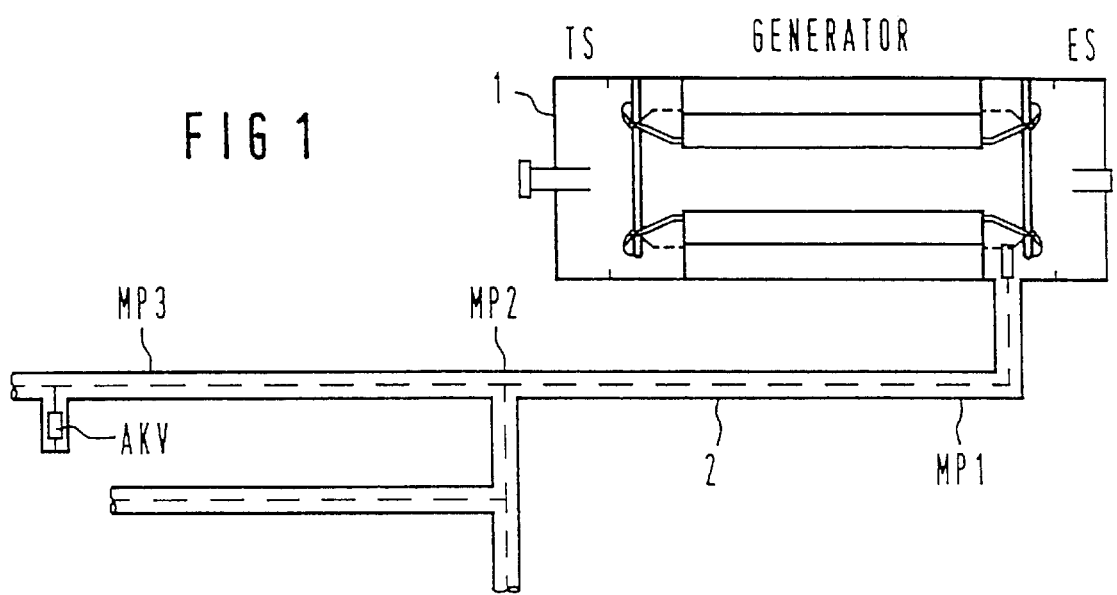
FIG. 1 shows a schematic of an encapsulated main lead of a power station.

According to the invention, this object is achieved by means of a device having the features of claim 1. The method according to the invention for locating the fault is subject matter of claim 9. Advantageous developments are the subject matter of the subclaims.

DETAILED DESCRIPTION OF THE INVENTION

The at least approximate determination of the fault location at which partial discharges are produced is performed by means of a device which has at least two coupling units which are coupled to measuring points, situated at a distance from one another, of a conductor of the high-voltage machine and/or high-voltage system. These coupling units are connected to an evaluation device. The temporal sequence of the signal coupled out for each coupling unit is recorded and/or correlated in the evaluation device. The coupled-out signals (oscillations) can be recorded comparatively and evaluated in terms of their propagation time difference. The place of origin can be localized in this way by a skilful, preferably variable, selection of the measuring points. A more accurate locating of a fault can thereby be achieved. In other words, the device permits the locating of partial discharges in dynamoelectric high-voltage machines and/or high-voltage systems even during normal operation, a locating which is based on a propagation time measurement. Simultaneously recording the signals at the measuring points ensures a reliable assignment for the signal tracking.

In order to keep as low as possible the influence of the measuring instrument itself on the propagation time of the high-frequency oscillation spectrum of the partial discharges, the coupling units are preferably connected to the evaluation device via electric conductors of equal length. The conductors are preferably coaxial cables.

In accordance with a further advantageous development, it is proposed to provide each coupling unit with a filter, preferably a highpass filter. Such a filter suppresses the oscillations of the sheath eddies. The highpass filter is preferably a 30 kHz highpass filter which suppresses 50 Hz and 60 Hz sheath eddies. The signals are therefore coupled out in a relatively broadband fashion at high frequencies.

The signal outputs of the highpass filters are preferably isolated in order to avoid earth loops. The filters are earthed at a central neutral point via lines of equal length.

According to a further advantageous development of the device, the evaluation unit according to the invention comprises a storage oscilloscope which represents pulse oscillograms of at least two measuring points. The storage oscilloscope is preferably a high-resolution oscilloscope in which in each case two measuring points are represented simultaneously, as a result of which the temporal sequence of the signals can be verified at the individual measuring points. The direction of travel of the high-frequency partial discharge can be determined from the temporal sequence of the signals at the individual measuring points. By displacing the measuring points on the conductor, the coupling units being arranged detachably, it is possible for the place of origin of the partial discharges to be located with increasing accuracy. The fault is thereby located at least approximately. It is most favorable if measuring points can be arranged at the ends of the system or at least on both sides of the components to be monitored, in particular a turbogenerator. Partial discharges in all components, conductors of a high-voltage machine, that is to say in the generator, supply leads, exciters, auxiliary power sources etc., can be detected using the device.

In the method according to the invention for locating partial discharges in dynamoelectric high-voltage machines and/or high-voltage systems, it is proposed to couple at least two coupling units to mutually spaced measuring points of a conductor of the high-voltage machine and/or high-voltage system. The high-frequency electromagnetic signal produced upon the occurence of partial discharges, which can have a frequency spectrum, is coupled out from the conductor by the coupling units and led to an evaluation device. The temporal sequence of the signal coupled out by each coupling unit is compared in the evaluation device, as a result of which the direction of travel of the partial discharges is determined. The source of the fault can be located from the direction of travel. The oscillograms preferably compare the oscillations at the measuring points in pairs.

The rate of propagation of the oscillations in the individual subregions of the system can be determined by suitable preliminary tests. Knowledge of the rate of propagation can be used for the purpose of qualitative evaluation of the propagation time measurements.

It is preferred for at least three coupling units to be coupled to the conductors, since this simplifies the determination of the direction of propagation and thus the locating of partial discharges. This is advantageous, in particular, for locating in a multicomponent system having various conductors. The coupling units are preferably to be arranged equidistant from one another, so that the place of origin of the fault is easier to establish knowing the rate of propagation of the oscillations in the conductor.

The oscillations are introduced into the conductor at the place of origin. They propagate inside the conductor in all directions. The coupling units are arranged successively in the longitudinal direction of a conductor. It cannot be established reliably whether the point of origin of the fault is upstream or downstream of a measuring point which forms an outer bound of a measuring interval. A measuring interval is understood as a section of the conductor which is bounded by the measuring points. In order to be able uniquely to determine the location of the fault, it is therefore proposed to position the coupling unit, which has recorded oscillations last in time in comparison with other coupling units, between two neighboring coupling units which recorded the oscillations earlier. It can be decided particularly easily thereby whether the location of the fault is inside the measuring interval.

According to a further idea, a method is proposed in which upstream of the measuring point of the coupling unit which is first to record the oscillations a coupling unit is arranged at an additional measuring point situated upstream of this measuring point.

Further advantages and features of the invention are explained with the aid of an exemplary embodiment.

A water collecting ring of a generator 20 is denoted by the reference symbol 1 in FIG. 1. Arranged respectively on the water collecting ring 1, on the turbine side and on the exciter side, of the stator winding of the generator 20 is a measuring point TS or ES at which oscillations are coupled out. Three mobile measuring points MP1, MP2 and MP3 are arranged on the conductor 2. A stationary measuring point AKV is likewise arranged on the conductor 2. The oscillations produced in the case of partial discharges are coupled out at the individual measuring points MP1, MP2, MP3, AKV.

Figure 2:
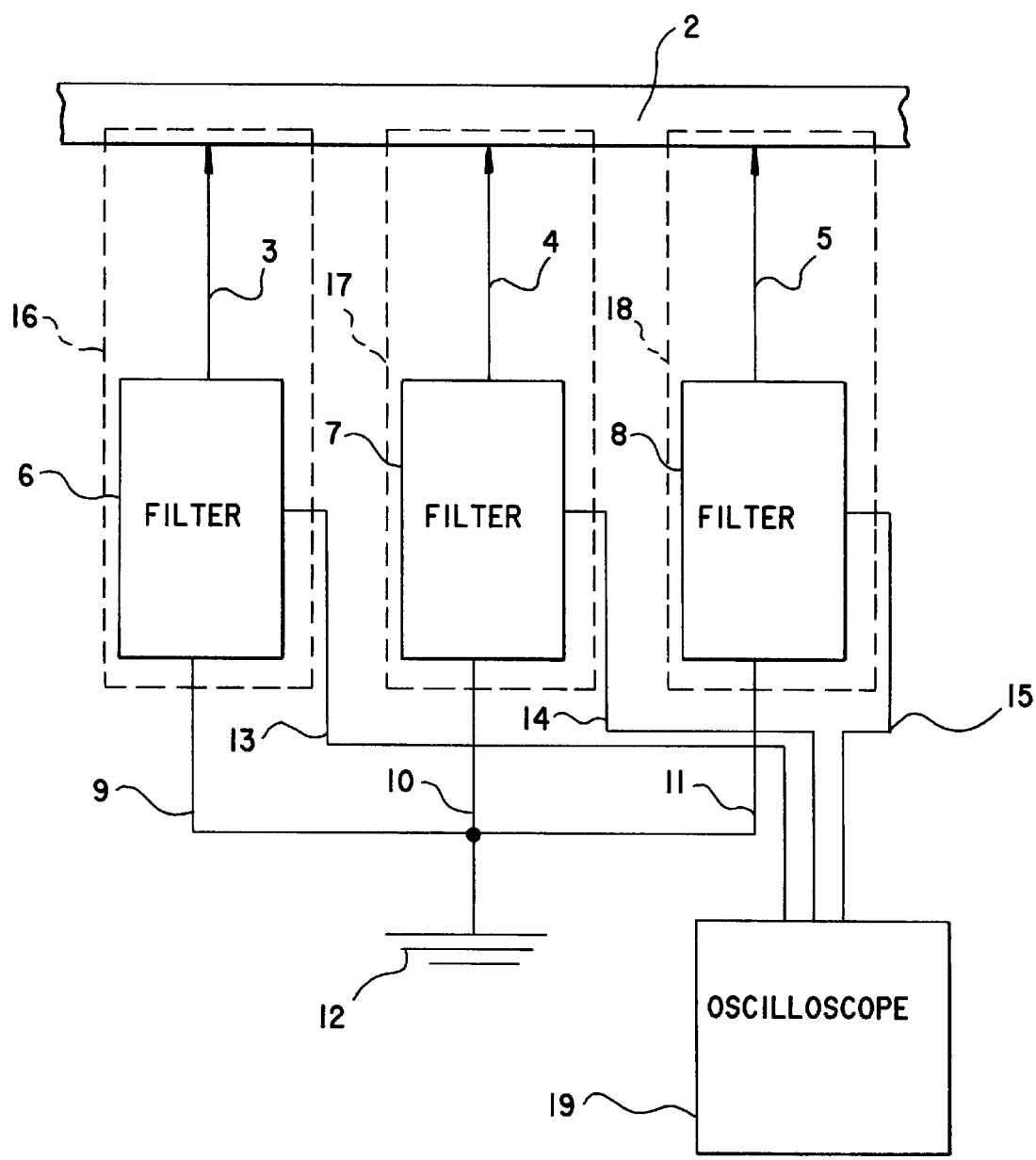
FIG. 2 shows the arrangement of a measuring circuit schematically.

The arrangement of the coupling units 16, 17, 18 for coupling out oscillations from a conductor 2 is represented schematically in FIG. 2. A filter 6, 7, 8 is arranged respectively in each connecting lead 3, 4, 5. The filters 6, 7, 8 are respectively a 30 kHz filter. The length of the leads 3, 4 and 5 is the same in each case. The signal outputs of the highpass filters 6, 7 and 8 are respectively earthed at a central neutral point 12 by means of earth cables 9, 10 and 11 of equal length. Each filter 6, 7, 8 is connected via a coaxial line 13, 14, 15 to a storage oscilloscope 19. A three-channel storage oscilloscope is used in the case of the measuring circuit according to FIG. 2. The coaxial lines 13, 14 and 15 are preferably of equal length.

A reliable assignment is assured for the signal tracking by simultaneously recording the oscillation pulses at the measuring point AKV at the measuring point MP1. The same also holds for the further measuring points, in particular the measuring points TS and ES on the water collecting rings 1 of the generator 20.

Figure 3A:
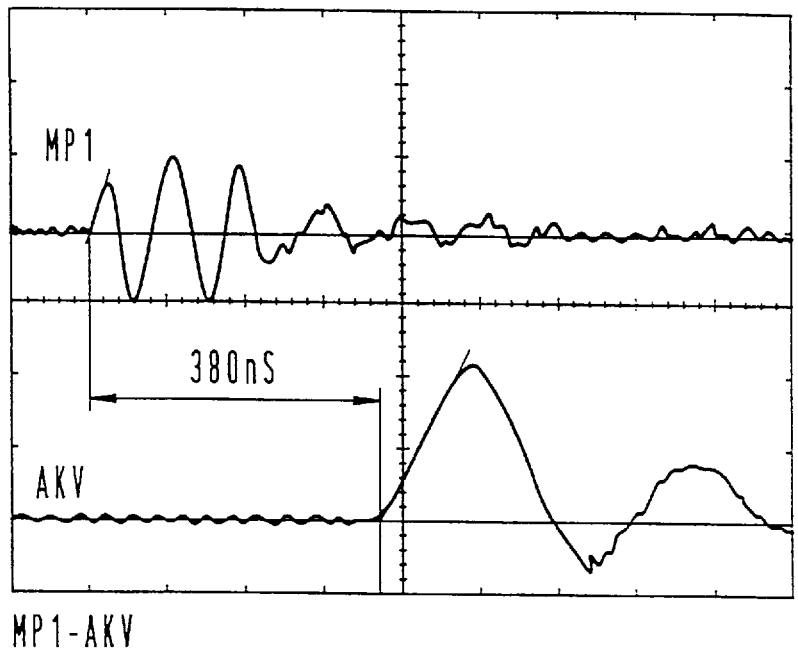
FIG. 3a shows an oscillogram at measuring points MP1 and AKV.
Figure 3B:
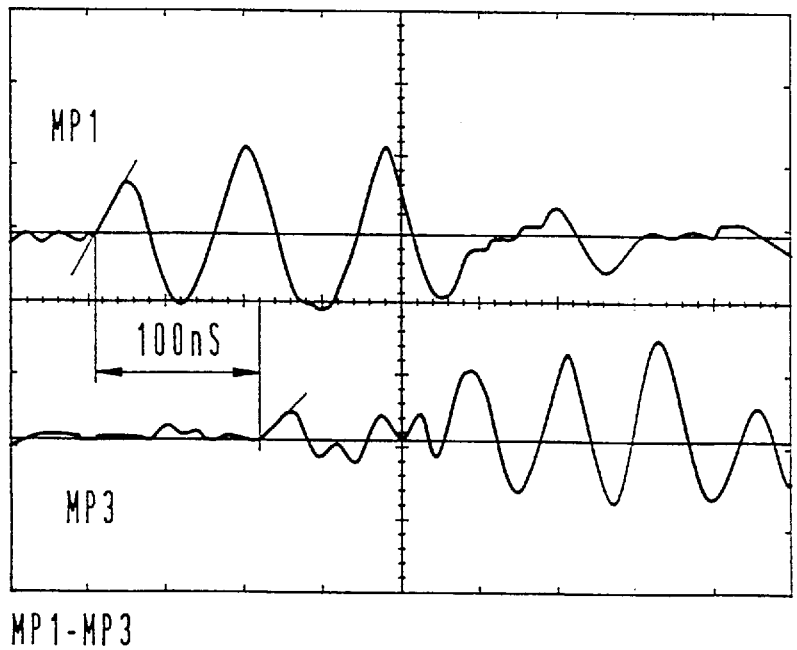
FIG. 3b shows an oscillogram at measuring points MP1 and MP3.
Figure 3C:
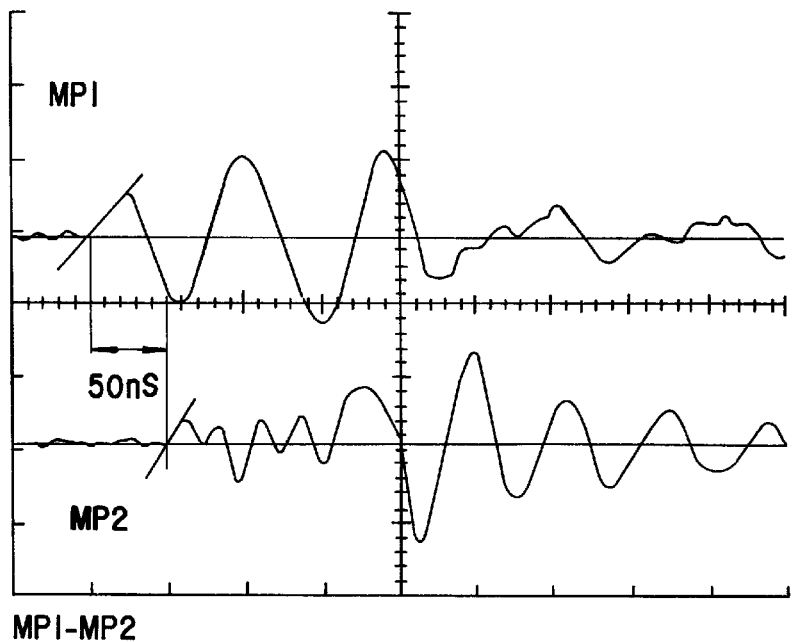
FIG. 3c shows an oscillogram at measuring points MP1 and MP2.
Figure 3D:
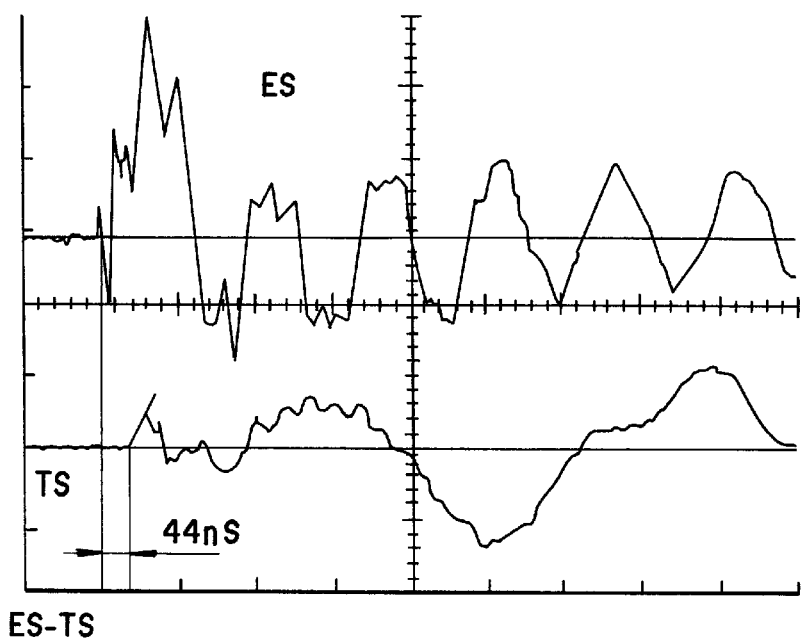
FIG. 3d shows an oscillogram at measuring points ES and TS.

A fault source is located with the aid of pulse oscillograms which have a high temporal resolution and in which two measuring points are simultaneously represented in each case. The signal sequence can be detected from the pulse oscillogram. The pulse oscillogram at the measuring point MP1 and at the measuring point AKV is represened in FIG. 3*a*. It is evident that the discharges firstly reach the measuring point MP1. In the generator 20 itself, the partial discharge pulses impinge with a high amplitude on the water collecting ring on the exciter side before they later arrive at the water collecting ring 1 on the turbine side. The partial discharge pulses on the water collecting ring on the exciter side are represented at the measuring point ES in FIG. 3*d*. The excitation at the measuring point TS, which is arranged on the water ring on the turbine side, is likewise evident from FIG. 3d. The qualitative differences with regard to the exciter amplitude result from attenuations between the two measuring points ES and TS. It can be deduced from the temporal sequence of the measured pulses caused by partial discharges that the fault source is located in the winding overhang region of the generator on the exciter side. A more precise localization of the fault location can be achieved by displacing the measuring points upstream of the measuring point ES.

The invention is particularly suitable for large generators, in particular having water-cooled stator windings, with an output of, for example, 1000 MVA and more.

We claim:

1. A device for locating partial discharges in dynamoelectric high-voltage machines and/or high-voltage systems, comprising at least two coupling units (16, 17, 18) which are detachably coupled to mutually spaced measuring points (MP1, MP2, MP3, ES, TS AKV) of a conductor (2) of the high-voltage machine and/or high-voltage system which couple out a high-frequency electromagnetic signal produced upon the occurrence of partial discharges, and an evaluation device which is electrically connected to each coupling unit (16, 17, 18) of said at least two coupling units, wherein the evaluation device records as a function of time the signal coupled out by each coupling unit (16, 17, 18) of said at least two coupling units, and wherein the evaluation device correlates at least two recordings of the signal coupled out.

2. The device as claimed in claim 1, wherein the coupling units (16, 17, 18) are connected to the evaluation device via electric conductors (13, 14, 15) of equal length.

3. The device as claimed in claim 2, wherein each conductor (13, 14, 15) is a coaxial cable.

4. A device for locating partial discharges in dynamoelectric high-voltage machines and/or high-voltage systems, the device comprising; at least first and second coupling units (16, 17, 18) which are coupled to mutually spaced measuring points (MP1, MP2, MP3, ES, TS AKV) of a conductor (2) of the high-voltage machine and/or high-voltage system, wherein the at least first and second coupling units couple out a high-frequency electromagnetic signal produced upon the occurrence of partial discharges; an evaluation device which is electrically connected to the at least first and second coupling units (16, 17, 18), wherein the evaluation device records as a function of time the signal coupled out by each coupling unit of the at least first and second coupling units (16, 17, 18), and wherein the evaluation device correlates at least two recordings of the signal coupled out by each of the at least first and second coupling units; and a third coupling unit (17) detachably coupled to a measuring point between the at least first and second coupling units (16, 18), wherein the third coupling unit (17) is movable to further measuring points depending on the correlation of the recorded signal coupled by each coupling unit of the at least first and second coupling units, whereby the device precisely locates the place of origin of the partial discharge.

5. The device as claimed in claim 1 or 4, further comprising at least two highpass filters (6, 7, 8) electrically connected between at least two coupling units, respectively, and the evaluation device.

6. The device as claimed in claim 5, wherein the signal output of the highpass filter is isolated.

7. The device as claimed in claim 5, wherein the filters (6, 7, 8) are earthed at a common point (12) via lines (9, 10, 11) of equal length.

8. The device as claimed in claim 5, wherein the evaluation device comprises a storage oscilloscope which simultaneously represents pulse oscillograms of at least two measuring points (MP1, MP2, MP3, ES, TS, AKV).

9. A method for locating partial discharges in dynamo-electric high-voltage machines and/or high-voltage systems, the method comprising:

coupling at least two detachable coupling units (16, 17, 18) to mutually spaced measuring points (MP1, MP2, MP3, ES, TS, AKV) of a conductor (2) of the high-voltage machine and/or high-voltage system, coupling out a high-frequency electromagnetic signal produced upon the occurrence of partial discharges with the at least two detachable coupling units, leading the coupled out high-frequency electromagnetic signal to an evaluation device which is electrically connected to the at least two detachable coupling units (16, 17, 18), recording as a function of time the signal coupled out by each coupling unit of the at least two coupling units (16, 17, 18) with the evaluation device, and correlating with the evaluation device at least two recordings of the signal coupled out by each coupling unit of the at least two coupling units.

10. The method as claimed in claim 9, in which said recording comprises recording pulse oscillograms of the signals and said correlating comprises comparing the pulse oscillograms recorded at the measuring points (MP1, MP2, MP3, ES, TS, AKV) in pairs.

11. The method as claimed in claim 9, in which a rate of propagation of the signals in the conductor (2) is calibrated.

12. The method as claimed in claim 9, in which said coupling at least two coupling units comprises coupling at least first, second and third coupling units (16, 17, 18) to the conductor (2).

13. The method as claimed in claim 9, in which the coupling units (16, 17, 18) are arranged equidistant from one another.

14. A method for locating partial discharges in dynamo-electric high-voltage machines and/or high-voltage systems, the method comprising:

coupling at least three detachable coupling units (16, 17, 18) to mutually spaced measuring points (MP1, MP2, MP3, ES, TS, AKV) of a conductor (2) of the high-voltage machine and/or high-voltage system, coupling out a high-frequency electromagnetic signal produced upon the occurrence of partial discharges with the at least three detachable coupling units, leading the coupled out high-frequency electromagnetic signal to an evaluation device which is electrically connected to the at least three detachable coupling units (16, 17, 18), recording as a function of time the signal coupled out by each of the at least three coupling units (16, 17, 18) with the evaluation device, correlating with the evaluation device the recorded signals coupled out by each of the at least three coupling units (16, 17, 18) to determine a last-in-time coupling unit from the at least three coupling units which coupled out the signal last in time relative to two remaining coupling units of the at least three coupling units (16, 17, 18), and arranging the last-in-time coupling unit between the two remaining coupling units.

15. The method as claimed in claim 12, wherein the measuring point of the first coupling unit is first to record the signal with respect to the second and third coupling units, the method further comprising arranging the second coupling unit at an additional measuring point situated opposite the third coupling unit with the first coupling unit between.

16. The method as claimed in one of claims 9 to 15, which is carried out during the normal operation of the high-voltage machine or high-voltage system.

17. The device as claimed in claim 5, wherein said highpass filter comprises a 30 kHz highpass filter.

18. The device as claimed in one of claims 1 to 4 or 6 to 7, wherein the evaluation device comprises a storage oscilloscope which simultaneously represents pulse oscillograms of at least two measuring points (MP1, MP2, MP3, ES, TS, AKV).

* * * * *